United States Patent
Hao

(10) Patent No.: US 10,168,593 B2
(45) Date of Patent: Jan. 1, 2019

(54) LIQUID CRYSTAL DISPLAY PANEL HAVING DUAL CAPACITORS CONNECTED IN PARALLEL TO SHIFT REGISTER UNIT AND ARRAY SUBSTRATE THEREOF

(71) Applicant: Shenzhen China Star Optoelectronics Technology Co., Ltd., Shenzhen, Guangdong (CN)

(72) Inventor: Sikun Hao, Guangdong (CN)

(73) Assignee: Shenzhen China Star Optoelectronics Co., Ltd, Shenzhen, Gaungdong (CN)

( * ) Notice: Subject to any disclaimer, the term of this patent is extended or adjusted under 35 U.S.C. 154(b) by 915 days.

(21) Appl. No.: 14/433,655

(22) PCT Filed: Jan. 6, 2015

(86) PCT No.: PCT/CN2015/070189
§ 371 (c)(1),
(2) Date: Apr. 4, 2015

(87) PCT Pub. No.: WO2016/106791
PCT Pub. Date: Jul. 7, 2016

(65) Prior Publication Data
US 2018/0074378 A1 Mar. 15, 2018

(30) Foreign Application Priority Data
Dec. 30, 2014 (CN) .......................... 2014 1 0850807

(51) Int. Cl.
*G02F 1/1362* (2006.01)
*G02F 1/1333* (2006.01)
(Continued)

(52) U.S. Cl.
CPC ...... *G02F 1/136286* (2013.01); *G02F 1/1333* (2013.01); *G02F 1/1362* (2013.01);
(Continued)

(58) Field of Classification Search
CPC ............. H01L 27/3244; H01L 27/3265; H01L 27/1251; G09G 3/3266; G09G 3/3208;
(Continued)

(56) References Cited

U.S. PATENT DOCUMENTS 6,972,432 B1 * 12/2005 Furuya .............. G02F 1/133553
257/59
8,743,030 B2 6/2014 Shishido
(Continued)

*Primary Examiner* — Huyen Ngo
(74) *Attorney, Agent, or Firm* — Andrew C. Cheng

(57) ABSTRACT

Disclosed are a liquid crystal display panel and an array substrate thereof. The array substrate includes a substrate body, a first metal layer, a first dielectric layer, and a second dielectric layer, an insulating layer, and an electrode layer. The first metal layer, the first dielectric layer, and the second metal layer form a first capacitor; the second metal layer, the insulating layer, and the electrode layer form a second capacitor; the electrode layer is connected with the first metal layer through a channel hole penetrating through the first dielectric layer and the insulating layer, so that the first capacitor is connected with the second capacitor in parallel. Through the above way, the area of a gate driver on array (GOA) circuit on the array substrate can be reduced, which is beneficial for the narrow frame design of the liquid crystal display panel.

18 Claims, 2 Drawing Sheets

(51) Int. Cl.
*G02F 1/1368* (2006.01)
*G02F 1/1345* (2006.01)
*H01L 27/12* (2006.01)

(52) U.S. Cl.
CPC ........ *G02F 1/1368* (2013.01); *G02F 1/13454* (2013.01); *H01L 27/1255* (2013.01); *G02F 2001/13685* (2013.01); *G02F 2001/136295* (2013.01)

(58) Field of Classification Search
CPC ......... G09G 3/3233; G09G 2300/0866; G09G 2320/043; G09G 2320/045; G09G 2300/0842; G09G 2300/0819; G09G 2310/0256; G09G 3/329; G06F 3/0416; G06F 3/04; G06F 3/0412; G06F 3/044; G02F 1/13338
See application file for complete search history.

(56) References Cited

U.S. PATENT DOCUMENTS

| | | | |
|---|---|---|---|
| 8,847,214 B2* | 9/2014 | Sagawa | G09G 3/3233 257/40 |
| 8,946,719 B2 | 2/2015 | Tanaka et al. | |
| 2006/0056267 A1* | 3/2006 | Kim | G09G 3/3677 365/230.06 |
| 2008/0068326 A1 | 3/2008 | Chen et al. | |
| 2011/0007049 A1* | 1/2011 | Kikuchi | G09G 3/3677 345/208 |
| 2011/0012880 A1* | 1/2011 | Tanaka | G09G 3/3677 345/211 |
| 2013/0039455 A1 | 2/2013 | Horiuchi et al. | |
| 2017/0185194 A1* | 6/2017 | Kim | G06F 3/0412 |

* cited by examiner

LIQUID CRYSTAL DISPLAY PANEL HAVING DUAL CAPACITORS CONNECTED IN PARALLEL TO SHIFT REGISTER UNIT AND ARRAY SUBSTRATE THEREOF

BACKGROUND OF THE INVENTION

1. Field of the Invention

The present invention relates to technical field of liquid crystal display, and in particular to liquid crystal display panel and array substrate thereof.

2. The Related Arts

Currently, more and more liquid crystal display utilize the technology of fabricating gate driving circuit on array substrate, named as GOA (Gate Driver On Array), which can reduce the frame width of the array substrate to the trend of designing liquid crystal display with narrow frame.

The present GOA circuit is normally composed of multiple shift register units, each shift register unit connect a gate line, the output high level signal from the gate line of the previous row charge the capacitor within the shift register units, and supply power to the gate line of the present line, so that the high level signal can be output by the gate line, and then the high level signal outputted from the next gate line are utilized to realize reset. For outputting the high level signal from the gate line of the present line, the enough capacitor should be ensured, wherein the capacitor means the area on the array substrate. However, the capacitor with large area is against the design of liquid crystal display with narrow frame.

SUMMARY OF THE INVENTION

The technical problem to be solved by the embodiment of the present invention is to provide a self-capacitance type touch panel and the conductive layer structure thereof, which can determinate the real touch point accurately.

An aspect of the present invention is to provide an array substrate, comprising: a substrate body, a first metal layer, a first dielectric layer, a second metal layer, an insulating layer, an electrode layer, which are arranged on the substrate body; the first metal layer, the first dielectric layer, and the second metal layer forming a first capacitor; the second metal layer, the insulating layer, and the electrode layer forming a second capacitor; the electrode layer being connected with the first metal layer through a channel hole penetrating through the first dielectric layer and the insulating layer, so that the first capacitor is connected with the second capacitor in parallel; wherein the array substrate further comprises a thin-film transistor arranged on the substrate body and a shift register unit located at a non-display area, the first capacitor and the second capacitor are connected with the shift register unit in parallel, the thin-film transistor comprising a gate electrode, a source electrode, and a drain electrode, the gate electrode and the first metal layer are formed synchronously, the second metal layer and a source-drain electrode layer composed of the source electrode and the drain electrode are formed synchronously, the first dielectric layer of the first capacitor and the first dielectric layer provided between the source-drain electrode layer and the gate electrode are formed synchronously.

Wherein, the projected area of the first metal layer on the substrate body along the direction vertical to the substrate body is larger than that of the second metal layer, and the channel hole is arranged outside the projected area corresponding to the second metal layer.

Wherein, the array substrate comprises a first area and a second area, and the thin-film transistor is located at the first area, and the electrode layer is arranged on the insulating layer of the second area.

Wherein, the thin-film transistor further comprises a semiconductor layer provided on the substrate body, and a second dielectric layer is provided between the semiconductor layer and the gate electrode, and the first metal layer is arranged on the second dielectric layer, and the source electrode and the drain electrode penetrate the first dielectric layer and the second dielectric layer and are connected with the semiconductor layer.

Wherein, the thin-film transistor further comprises a semiconductor layer provided between the gate electrode and the source-drain electrode, and the second dielectric layer is provided between the semiconductor layer and the gate electrode, and the first dielectric layer is provided between the semiconductor layer and the source-drain electrode, the source electrode and the drain electrode penetrate the first dielectric layer and are connected with the semiconductor layer.

Another aspect of the present invention is to provide An array substrate, comprising: a substrate body, a first metal layer, a first dielectric layer, a second metal layer, an insulating layer, an electrode layer, which are arranged on the substrate body; the first metal layer, the first dielectric layer, and the second metal layer forming a first capacitor; the second metal layer, the insulating layer, and the electrode layer forming a second capacitor; the electrode layer being connected with the first metal layer through a channel hole penetrating through the first dielectric layer and the insulating layer, so that the first capacitor is connected with the second capacitor in parallel.

Wherein, the array substrate further comprises a shift register unit located at a non-display area, and the first capacitor and the second capacitor are connected with the shift register unit in parallel.

Wherein, the projected area of the first metal layer on the substrate body along the direction vertical to the substrate body is larger than that of the second metal layer, and the channel hole is arranged outside the projected area corresponding to the second metal layer.

Wherein, the array substrate further comprises a thin-film transistor arranged on the substrate body, and the thin-film transistor comprises a gate electrode, a source electrode, and a drain electrode, the gate electrode and the first metal layer are formed synchronously, the second metal layer and a source-drain electrode layer composed of the source electrode and the drain electrode are formed synchronously, the first dielectric layer of the first capacitor and the first dielectric layer provided between the source-drain electrode layer and the gate electrode are formed synchronously.

Wherein, the array substrate comprises a first area and a second area, and the thin-film transistor is located at the first area, and the electrode layer is arranged on the insulating layer of the second area.

Wherein, the thin-film transistor further comprises a semiconductor layer provided on the substrate body, and a second dielectric layer is provided between the semiconductor layer and the gate electrode, and the first metal layer is arranged on the second dielectric layer, and the source electrode and the drain electrode penetrate the first dielectric layer and the second dielectric layer and are connected with the semiconductor layer.

Wherein, the thin-film transistor further comprises a semiconductor layer provided between the gate electrode and the source-drain electrode layer, and the second dielectric layer is provided between the semiconductor layer and the gate electrode, and the first dielectric layer is provided between the semiconductor layer and the source-drain electrode layer, and the source electrode and the drain electrode penetrate the first dielectric layer and are connected with the semiconductor layer.

Wherein, the distance between the second metal layer and the substrate body is the same as the distance between the source-drain electrode layer and the substrate body.

Wherein, the thickness of the gate electrode is the same as the thickness of the first metal layer, and the thickness of the source-drain electrode layer is the same as the thickness of the second metal layer.

Another aspect of the present invention is to provide a liquid crystal display panel, comprising: a color film substrate arranged opposite to an array substrate, and a liquid crystal layer provided between the color film substrate and the array substrate, wherein the array substrate, comprising: a substrate body, a first metal layer, a first dielectric layer, a second metal layer, an insulating layer, an electrode layer, which are arranged on the substrate body; the first metal layer, the first dielectric layer, and the second metal layer forming a first capacitor; the second metal layer, the insulating layer, and the electrode layer forming a second capacitor; the electrode layer being connected with the first metal layer through a channel hole penetrating through the first dielectric layer and the insulating layer, so that the first capacitor is connected with the second capacitor in parallel.

Wherein, the array substrate further comprises a shift register unit located at a non-display area, and the first capacitor and the second capacitor are connected with the shift register unit in parallel.

Wherein, the array substrate further comprises a thin-film transistor arranged on the substrate body, and the thin-film transistor comprises a gate electrode, a source electrode, and a drain electrode, the gate electrode and the first metal layer are formed synchronously, the second metal layer and a source-drain electrode layer composed of the source electrode and the drain electrode are formed synchronously, the first dielectric layer of the first capacitor and the first dielectric layer provided between the source-drain electrode layer and the gate electrode are formed synchronously.

Wherein, the array substrate comprises a first area and a second area, and the thin-film transistor is located at the first area, and the electrode layer is arranged on the insulating layer of the second area.

Wherein, the thin-film transistor further comprises a semiconductor layer provided on the substrate body, and a second dielectric layer is provided between the semiconductor layer and the gate electrode, and the first metal layer is arranged on the second dielectric layer, and the source electrode and the drain electrode penetrate the first dielectric layer and the second dielectric layer and are connected with the semiconductor layer.

Wherein, the thin-film transistor further comprises a semiconductor layer provided between the gate electrode and the source-drain electrode, and the second dielectric layer is provided between the semiconductor layer and the gate electrode, and the first dielectric layer is provided between semiconductor layer and the source-drain electrode, and the source electrode and the drain electrode penetrate the first dielectric layer and are connected with the semiconductor layer.

Through the above technical scheme, the beneficial effects of the embodiment of the invention are as follows.

The embodiment of the present invention is to design the first metal layer, the first dielectric layer, and the second metal layer forming a first capacitor; the second metal layer, the insulating layer, and the electrode layer forming a second capacitor; the electrode layer being connected with the first metal layer through a channel hole penetrating through the first dielectric layer and the insulating layer, so that the first capacitor is connected with the second capacitor in parallel, which means that the area of the GOA circuit on the array substrate can be reduced when enough capacitor is ensured. It is beneficial for the narrow frame design of the liquid crystal display panel.

DETAILED DESCRIPTION OF THE PREFERRED EMBODIMENTS

In the following embodiments of the invention in conjunction with the accompanying drawings, embodiments of the present invention, the technical solutions clearly and completely described, obviously, the described embodiments are only part of the embodiments of the present invention, but not all of the implementation of the case. Based on the embodiment of the present invention, persons of ordinary skill in the art without creative efforts obtained under the premise that all other embodiments, all belong to the protection scope of the present invention.

Figure 1:
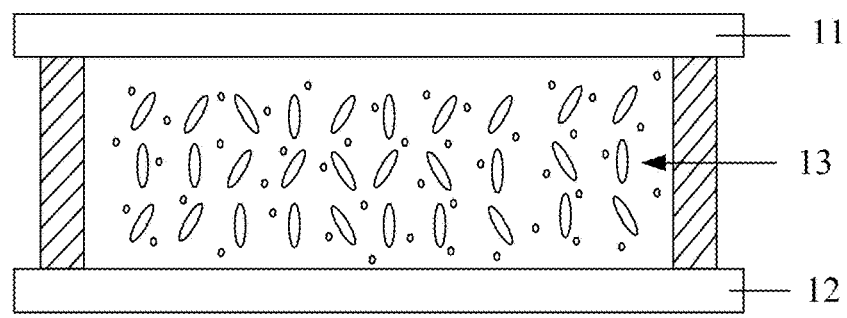
FIG. 1 is the schematic diagram of an liquid crystal panel according to the embodiment of the present invention.

FIG. 1 is the schematic diagram of a liquid crystal panel according to the embodiment of the present invention. Referring to FIG. 1, a liquid crystal panel 10 comprises a first substrate 11, a second substrate 12, and a liquid crystal layer 13, and the first substrate 11 is arranged opposite to the second substrate 12 with an interval, wherein the second substrate 12 can be CF (Color Filter) color substrate, correspondingly, the first substrate 11 can be TFT (Thin Film Transistor) array substrate.

Figure 2:
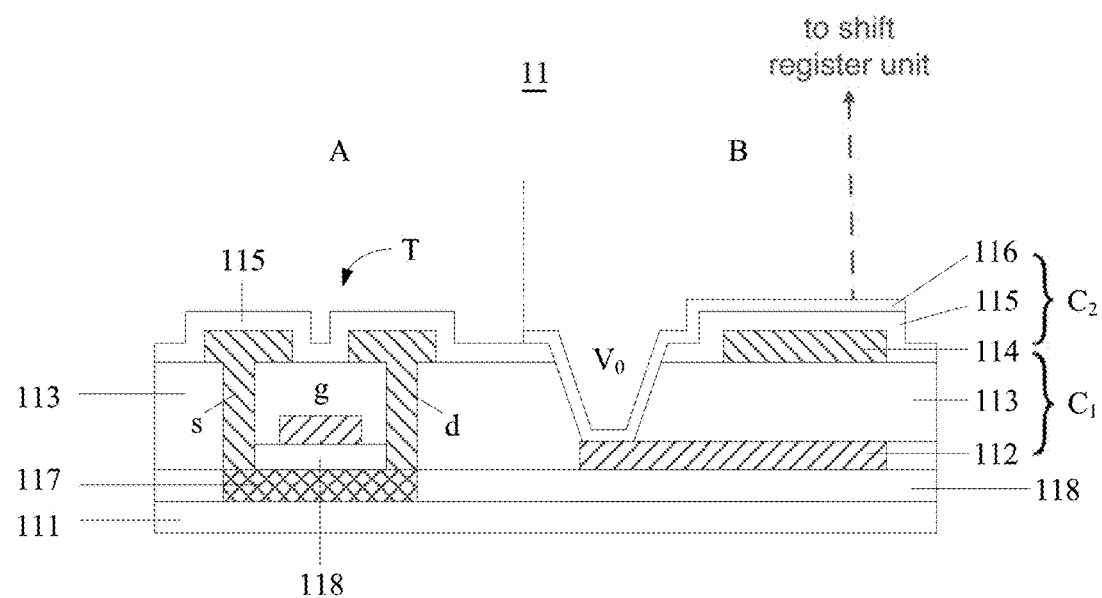
FIG. 2 is a cross-sectional view diagram of an array substrate as shown in FIG. 1 according to the embodiment of the present invention.

FIG. 2 is a cross-sectional view diagram of an array substrate as shown in FIG. 1 according to the embodiment of the present invention. Referring to FIG. 2, the array substrate 11 (the first substrate) comprises a substrate body 111 and a thin film transistor T stack on the substrate body 111, a first metal layer 112, a first dielectric layer 113, a second metal layer 114, an insulating layer 115, and an electrode layer 116.

The array substrate 11 comprises a first area A and a second area B, and the thin-film transistor T is located at the first area A, and the electrode layer 116 is arranged on the insulating layer 115 of the second area B.

The thin-film transistor is located at the first area A, and the thin-film transistor comprises a gate electrode g, a source electrode s, and a drain electrode d, and a semiconductor layer 117 provided on the substrate body 111, wherein a second dielectric layer 118 is provided between the semiconductor layer 117 and the gate electrode g, and the second dielectric layer 118 also is arranged outside the area covered by the semiconductor layer 117. The first metal layer 112 is arranged on the second dielectric layer 118 at the second area B, and the source electrode s and the drain electrode d penetrate the first dielectric layer 113 and the second dielectric layer 118 and connect electrically the semiconductor layer 117.

It should be understood that the thin-film transistor T can be provided with other structure. For example, the semiconductor layer 111 provided between the gate electrode d and the source-drain electrode s, correspondingly, the second dielectric layer 118 at the first area 118 is provided between the semiconductor layer 117 and the gate electrode g, and the first dielectric layer 113 is provided between the semiconductor layer 117 and the source-drain electrode, and the source electrode s and the drain electrode d of the thin-film transistor T penetrate the first dielectric layer 113 and are connected with the semiconductor layer 117.

At the second area B, the first metal layer 112, the first dielectric layer 113, and the second metal layer 114 forming a first capacitor $C_1$; the second metal layer 114, the insulating layer 115, and the electrode layer 116 forming a second capacitor $C_2$; the electrode layer 116 being connected with the first metal layer 112 through a channel hole $V_0$ penetrating through the first dielectric layer 113 and the insulating layer 115, so that the first capacitor $C_1$ is connected with the second capacitor $C_2$ in parallel.

Wherein, the projected area of the first metal layer 112, along the direction vertical to the substrate body 111, is larger than the projected area of the second metal layer 114 on the substrate body 111, and the channel hole $V_0$ is arranged outside the projected area corresponding to the second metal layer 114.

The gate electrode g and the first metal layer 112 are formed synchronously, the second metal layer 114 and a source-drain electrode layer composed of the source electrode and the drain electrode are formed synchronously, the first dielectric layer 113 of the first capacitor $C_1$ and the first dielectric layer 113 provided between the source-drain electrode layer and the gate electrode g are formed synchronously. The second dielectric layer 118 at the first area A and the first area B are formed synchronously.

In present embodiment, the distance between the second metal layer 114 and the substrate body 111 is the same as the distance between the source-drain electrode layer and the substrate body 111.

In addition, the thickness of the gate electrode g is the same as the thickness of the first metal layer 112, for example, the thickness is 2000 Å. The thickness of the source-drain electrode layer is the same as the thickness of the second metal layer, for example, the thickness is 4000 Å. Furthermore, the embodiment of the present invention can arrange the thickness of the other layers, for example, the maximum thickness of the first dielectric layer 113 is 4000 Å; the maximum thickness of the semiconductor layer 117 is 600 Å; the maximum thickness of the second dielectric layer 118 is 700 Å.

Figure 3:
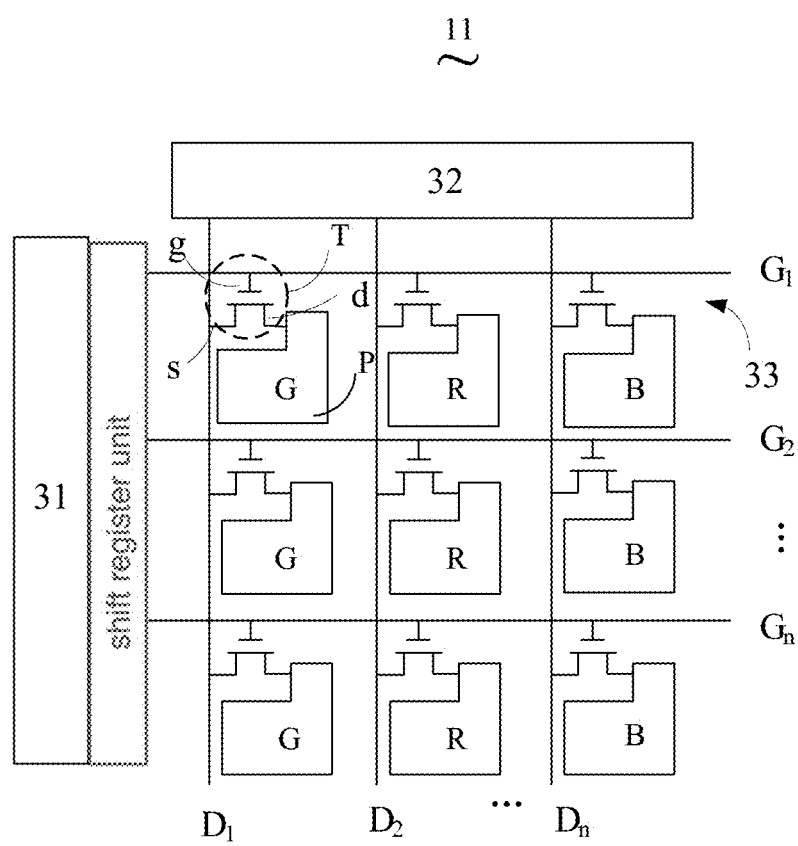
FIG. 3 is the schematic diagram of the pixel structure as shown in FIG. 1 according to the embodiment of the present invention.

FIG. 3 is the schematic diagram of the pixel structure as shown in FIG. 1 according to the embodiment of the present invention. Referring to FIG. 3, the array substrate 11 further comprises a gate driver 31, a data driver 32, multiple gate lines $G_1, G_2, \ldots, G_n$ arranged in parallel, and multiple data lines $D_1, D_2, \ldots, D_n$ arranged in parallel, which are crossed and insulated from the multiple gate line $G_1, G_2, \ldots, G_n$, wherein the multiple gate line $G_1, G_2, \ldots, G_n$ and multiple data line $D_1, D_2, \ldots, D_n$ determine the pixel region 33 arranged by multiple arrays.

Each pixel region 33 comprises a pixel electrode P and the thin-film transistor T as shown in FIG. 2, wherein the pixel electrode P is arranged opposite to the common electrode of the liquid crystal display 10, and the pixel electrode P connects the drain electrode d of the thin-film transistor T correspondingly. The gate lines connect the gate electrode g of the thin-film transistor T, and the data lines connect the source electrode s of the thin-film transistor T. As the thin-film transistor T being conductive, the data driving signal is transferred from the source electrode s to the pixel electrode P, so that the gate driver 31 provides a scanning signal with the correspondingly connected gate lines, for the pixel unit of the pixel region 33; the data driver 32 provides a gray scale signal with the correspondingly connected data lines, for the pixel unit of the pixel region 33.

The array substrate 11 further comprises multiple shift register units at a non-display area, and each shift register unit control the electric potential of a gate line, for example, the electric potential of the nth gate line $G_n$ is controlled by the shift register unit connected with the gate line $G_n$. Multiple shift register units connect the gate driver 31 to receive the driving signal, and the two shift register units are connected to each other with a signal line, so that each shift register unit can be guaranteed to control the charge and discharge of the gate line of each row.

In the present embodiment, the first capacitor $C_1$ and the second capacitor $C_2$ connect the shift register units in parallel, the output high level signal from the gate line of the previous row charge the first capacitor $C_1$ and the second capacitor $C_2$ within the shift register units, and supply power to the gate line of the present line through the first capacitor $C_1$ and the second capacitor $C_2$, so that the high level signal can be output by the gate line, and then the high level signal outputted from the next gate line are utilized to realize reset. Compared to a capacitor with present technology, the embodiment of the present invention utilizes the first capacitor $C_1$ and the second capacitor $C_2$ to charge and discharge, so that the area of the first capacitor $C_1$ and the second capacitor $C_2$, on the array substrate 11 along the direction vertical to the array substrate 11, can be reduced as enough capacitor are ensured, which means that the area of the GOA circuit on the array substrate 11 can be reduced. It is beneficial for the narrow frame design of the liquid crystal display panel 10.

Finally, it must be noted again that the above described embodiments of the invention only, and not limit the patent scope of the present invention, therefore, the use of all the contents of the accompanying drawings and the description of the present invention is made to equivalent structures or equivalent conversion process, e.g., between the embodiments example technology mutually binding characteristics, directly or indirectly related to the use of technology in other fields, are included within the scope of patent empathy protection of the invention.

What is claimed is:

1. An array substrate, comprising: a substrate body, a first metal layer, a first dielectric layer, a second metal layer, an insulating layer, an electrode layer, which are arranged on the substrate body; the first metal layer, the first dielectric layer, and the second metal layer forming a first capacitor; the second metal layer, the insulating layer, and the electrode layer forming a second capacitor; the electrode layer being connected with the first metal layer through a channel hole penetrating through the first dielectric layer and the insulating layer, so that the first capacitor is connected with the second capacitor in parallel;

wherein the array substrate further comprises a thin-film transistor arranged on the substrate body and a shift register unit located at a non-display area, the first capacitor and the second capacitor are connected with the shift register unit in parallel, the thin-film transistor comprising a gate electrode, a source electrode, and a drain electrode, the gate electrode and the first metal layer are formed synchronously, the second metal layer and a source-drain electrode layer composed of the source electrode and the drain electrode are formed synchronously, the first dielectric layer of the first capacitor and the first dielectric layer provided between the source-drain electrode layer and the gate electrode are formed synchronously;

wherein the first capacitor and the second capacitor that are connected with the shift register unit are separate from the source electrode and the drain electrode of the thin-film transistor.

2. The array substrate as claimed in claim 1, wherein the projected area of the first metal layer on the substrate body along the direction vertical to the substrate body is larger than that of the second metal layer, and the channel hole is arranged outside the projected area corresponding to the second metal layer.

3. The array substrate as claimed in claim 1, wherein the array substrate comprises a first area and a second area, and the thin-film transistor is located at the first area, and the electrode layer is arranged on the insulating layer of the second area.

4. The array substrate as claimed in claim 3, wherein the thin-film transistor further comprises a semiconductor layer provided on the substrate body, a second dielectric layer is provided between the semiconductor layer and the gate electrode, the first metal layer is arranged on the second dielectric layer, and the source electrode and the drain electrode penetrate the first dielectric layer and the second dielectric layer and are connected with the semiconductor layer.

5. The array substrate as claimed in claim 3, wherein the thin-film transistor further comprises a semiconductor layer provided between the gate electrode and the source-drain electrode, the second dielectric layer is provided between the semiconductor layer and the gate electrode, the first dielectric layer is provided between the semiconductor layer and the source-drain electrode, and the source electrode and the drain electrode penetrate the first dielectric layer and are connected with the semiconductor layer.

6. An array substrate, comprising: a substrate body, a first metal layer, a first dielectric layer, a second metal layer, an insulating layer, an electrode layer, which are arranged on the substrate body; the first metal layer, the first dielectric layer, and the second metal layer forming a first capacitor; the second metal layer, the insulating layer, and the electrode layer forming a second capacitor; the electrode layer being connected with the first metal layer through a channel hole penetrating through the first dielectric layer and the insulating layer, so that the first capacitor is connected with the second capacitor in parallel;

wherein the array substrate further comprises a shift register unit located at a non-display area, and the first capacitor and the second capacitor are connected with the shift register unit in parallel.

7. The array substrate as claimed in claim 6, wherein the projected area of the first metal layer on the substrate body along the direction vertical to the substrate body is larger than that of the second metal layer, and the channel hole is arranged outside the projected area corresponding to the second metal layer.

8. The array substrate as claimed in claim 6, wherein the array substrate further comprises a thin-film transistor arranged on the substrate body, the thin-film transistor comprises a gate electrode, a source electrode, and a drain electrode, the gate electrode and the first metal layer are formed synchronously, the second metal layer and a source-drain electrode layer composed of the source electrode and the drain electrode are formed synchronously, the first dielectric layer of the first capacitor and the first dielectric layer provided between the source-drain electrode layer and the gate electrode are formed synchronously.

9. The array substrate as claimed in claim 8, wherein the array substrate comprises a first area and a second area, and the thin-film transistor is located at the first area, and the electrode layer is arranged on the insulating layer of the second area.

10. The array substrate as claimed in claim 9, wherein the thin-film transistor further comprises a semiconductor layer provided on the substrate body, and a second dielectric layer is provided between the semiconductor layer and the gate electrode, and the first metal layer is arranged on the second dielectric layer, and the source electrode and the drain electrode penetrate the first dielectric layer and the second dielectric layer and are connected with the semiconductor layer.

11. The array substrate as claimed in claim 9, wherein the thin-film transistor further comprises a semiconductor layer provided between the gate electrode and the source-drain electrode layer, and the second dielectric layer is provided between the semiconductor layer and the gate electrode, and the first dielectric layer is provided between the semiconductor layer and the source-drain electrode layer, and the source electrode and the drain electrode penetrate the first dielectric layer and are connected with the semiconductor layer.

12. The array substrate as claimed in claim 8, wherein the distance between the second metal layer and the substrate body is the same as the distance between the source-drain electrode layer and the substrate body.

13. The array substrate as claimed in claim 8, wherein the thickness of the gate electrode is the same as the thickness of the first metal layer, and the thickness of the source-drain electrode layer is the same as the thickness of the second metal layer.

14. A liquid crystal display panel, comprising: a color film substrate arranged opposite to an array substrate, and a liquid crystal layer provided between the color film substrate and the array substrate, the array substrate comprising: a substrate body, a first metal layer, a first dielectric layer, a second metal layer, an insulating layer, an electrode layer, which are arranged on the substrate body; the first metal layer, the first dielectric layer, and the second metal layer forming a first capacitor; the second metal layer, the insulating layer, and the electrode layer forming a second capacitor; the electrode layer being connected with the first metal layer through a channel hole penetrating through the first dielectric layer and the insulating layer, so that the first capacitor is connected with the second capacitor in parallel;

wherein the array substrate further comprises a shift register unit located at a non-display area, and the first capacitor and the second capacitor are connected with the shift register unit in parallel.

15. The liquid crystal display panel as claimed in claim 14, wherein the array substrate further comprises a thin-film transistor arranged on the substrate body, and the thin-film transistor comprises a gate electrode, a source electrode, and a drain electrode, the gate electrode and the first metal layer are formed synchronously, the second metal layer and a source-drain electrode layer composed of the source electrode and the drain electrode are formed synchronously, the first dielectric layer of the first capacitor and the first dielectric layer provided between the source-drain electrode layer and the gate electrode are formed synchronously.

16. The liquid crystal display panel as claimed in claim 15, wherein the array substrate comprises a first area and a second area, and the thin-film transistor is located at the first area, and the electrode layer is arranged on the insulating layer of the second area.

17. The liquid crystal display panel as claimed in claim 16, wherein the thin-film transistor further comprises a semiconductor layer provided on the substrate body, and a second dielectric layer is provided between the semiconductor layer and the gate electrode, and the first metal layer is arranged on the second dielectric layer, and the source electrode and the drain electrode penetrate the first dielectric layer and the second dielectric layer and are connected with the semiconductor layer.

18. The liquid crystal display panel as claimed in claim 16, wherein the thin-film transistor further comprises a semiconductor layer provided between the gate electrode and the source-drain electrode, and the second dielectric layer is provided between the semiconductor layer and the gate electrode, and the first dielectric layer is provided between semiconductor layer and the source-drain electrode, and the source electrode and the drain electrode penetrate the first dielectric layer and are connected with the semiconductor layer.

* * * * *